United States Patent [19]
Shen et al.

[11] Patent Number: 5,587,944
[45] Date of Patent: Dec. 24, 1996

[54] HIGH DENSITY MULTISTATE SRAM AND CELL

[75] Inventors: Jun Shen, Phoenix; Herbert Goronkin, Tempe, both of Ariz.

[73] Assignee: Motorola, Schaumburg, Ill.

[21] Appl. No.: 617,247

[22] Filed: Mar. 18, 1996

[51] Int. Cl.$^6$ ............................................. G11C 11/36
[52] U.S. Cl. ............................................. 365/175; 365/105
[58] Field of Search .................................. 365/175, 207, 365/105, 72

[56] References Cited

U.S. PATENT DOCUMENTS

| | | | |
|---|---|---|---|
| 4,573,143 | 2/1986 | Matsukawa | 365/175 |
| 5,280,445 | 1/1994 | Shieh et al. | 365/175 |
| 5,390,145 | 2/1995 | Nakasha | 365/159 |
| 5,438,539 | 8/1995 | Mori | 365/159 |

Primary Examiner—David C. Nelms
Assistant Examiner—H. Nguyen
Attorney, Agent, or Firm—Eugene A. Parsons

[57] ABSTRACT

A high density multistate SRAM cell including N negative differential resistance diodes connected in series and to a load. The diodes and the load defining a memory node having N+1 stable states. A write transistor having a drain connected to the memory node and adapted to receive N+1 different amplitudes of voltage on the source, and a write signal on the gate. An amplifier having an input terminal connected to the memory node, and a read switch having an input terminal connected to the output terminal of the amplifier. A plurality of cells connected into a matrix with N+1 sense amplifiers associated with each column of the matrix so as to provide an output for each of the N+1 different amplitudes.

18 Claims, 6 Drawing Sheets

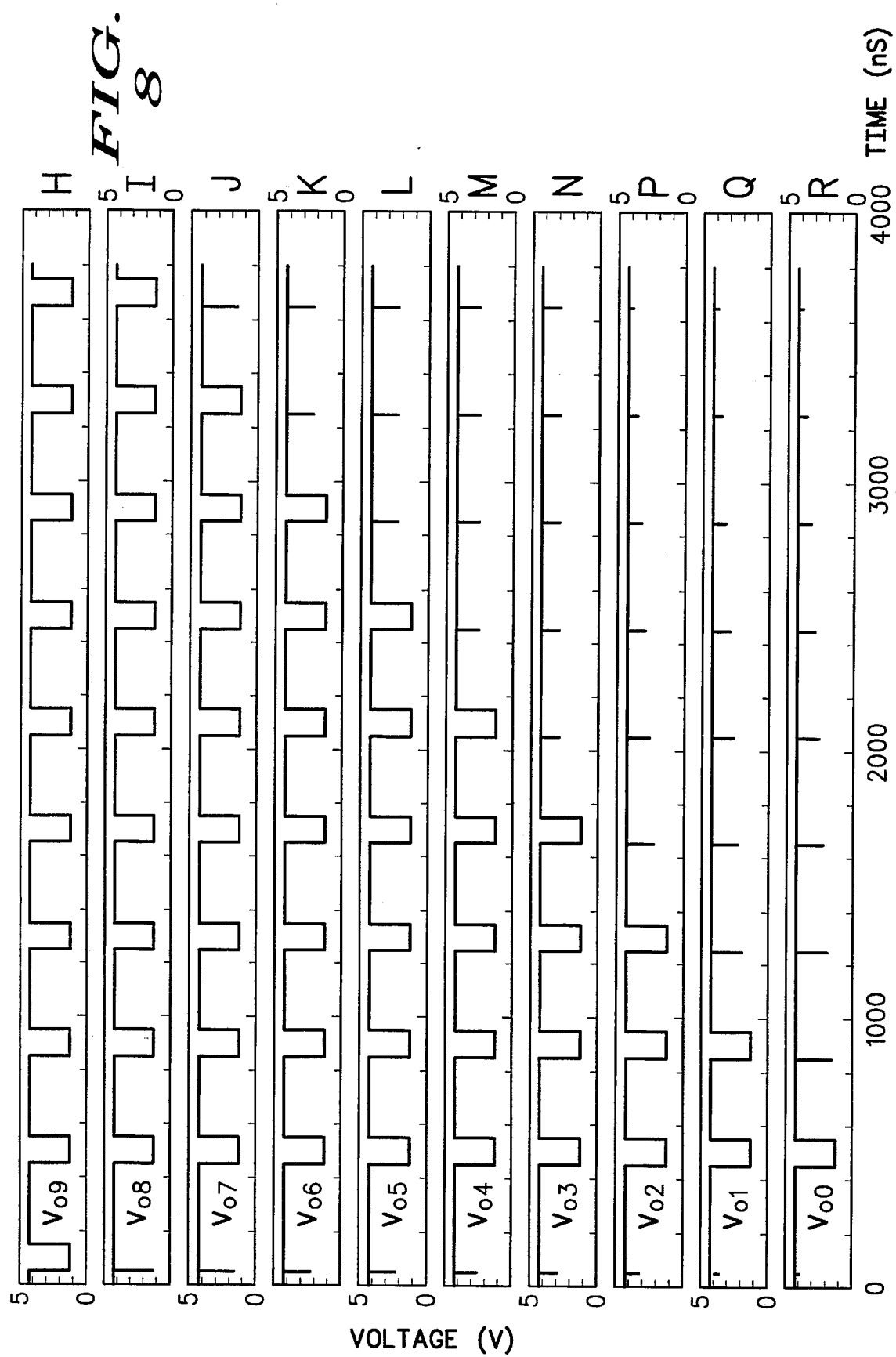

HIGH DENSITY MULTISTATE SRAM AND CELL

FIELD OF INVENTION

The present invention pertains to high density SRAMs and more specifically to new and improved multistate cells for high density SRAMs.

BACKGROUND OF THE INVENTION

Multistate static random access memories (SRAMs) are memories in which data can be written and/or rewritten as often as desired. Generally, the memories are static because the memory state does not change with time as long as the power supply is on.

Also, each cell of the memory has a plurality of states which can be written into the cell and subsequently sensed. The major problem that arises with prior art multistate memories is the time required to read the information stored in the memory in order to keep the static power consumption reasonably low. Also, in most prior art multistate memories, the size is a problem because of the devices or circuitry required to provide the multiple states.

Accordingly, it would be highly advantageous to provide small, high speed multistate SRAMs and SRAM cells.

It is a purpose of the present invention to provide new and improved multistate SRAM cells.

It is another purpose of the present invention to provide new and improved multistate SRAM cells which are relatively small and compact.

It is still another purpose of the present invention to provide new and improved multistate SRAM cells which operate at relatively high speed.

It is a further purpose of the present invention to provide new and improved multistate SRAM cells which are connected into an SRAM that has a relatively high speed and high density.

SUMMARY OF THE INVENTION

The above problems and others are at least partially solved and the above purposes and others are realized in a high density multistate SRAM cell including N negative differential resistance diodes connected in series and connected to a load, the negative differential resistance diodes and the load defining a memory node therebetween having N+1 stable states, a write device having a control terminal, an input terminal adapted to receive N+1 different amplitudes of voltage thereon, and an output terminal connected to the memory node, an amplifier having an input terminal connected to the memory node and an output terminal, and a read switch having an input terminal connected to the output terminal of the amplifier and an output terminal.

The above problems and others are at least partially solved and the above purposes and others are further realized in a high density multistate SRAM including a plurality of individual SRAM cells organized in a matrix of rows and columns. Each individual column of the matrix includes a state line connected to have N+1 different amplitudes of voltage applied thereto and an output line. The state line of each individual column is connected to the state terminal of each cell in the individual column and the output line of each individual column is connected to the cell output terminal of each cell in the individual column. Each individual row of the matrix includes a write line connected to the cell write terminal for each cell in the individual row and a cell read line connected to the cell read terminal of each cell in the individual row. N+1 sense amplifiers are associated with each individual column, with each sense amplifier having an input terminal connected to the output line of the associated individual column and an output terminal. Each of the N+1 sense amplifiers associated with an individual column have a different one of N+1 different amplitudes of voltage applied thereto as a reference voltage.

BRIEF DESCRIPTION OF THE DRAWINGS

Referring to the drawings.

DESCRIPTION OF THE PREFERRED EMBODIMENT

Figure 1:
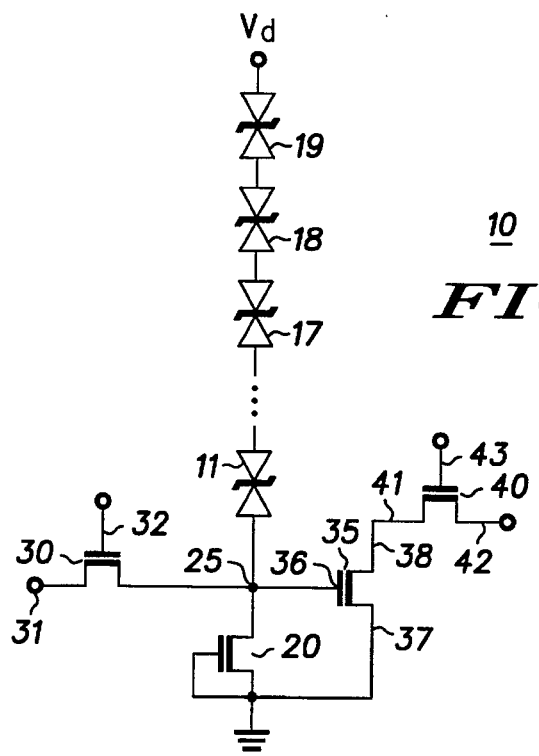
FIG. 1 is a schematic representation of a multistate SRAM cell in accordance with the present invention.

Referring now to FIG. 1, a schematic view of a specific multistate SRAM cell 10 embodying the present invention is illustrated. Cell 10 includes N negative differential resistance diodes (in this specific embodiment nine) designated 11 through 19 connected in series and connected to a load 20. The N negative differential resistance diodes can be any of the various devices known in the art, including resonant tunneling diodes, Esaki diodes, etc. Series connected diodes 11 through 19 are connected at one end to a potential Vd and at the other end to a memory node 25. Load 20, which in this specific embodiment is a transistor but could be a resistor or any other component capable of operating as a load, has a drain terminal connected to memory node 25 and source and gate terminals connected together to a reference potential such as ground. Memory node 25 has N+1 stable states, as will be described in more detail presently.

Cell 10 further includes a write device, which in this embodiment is a single write transistor 30 but may be a variety of different switching devices. Write transistor 30 has a drain connected to an input, or state terminal 31, adapted to receive N+1 different amplitudes (or states) of voltage thereon, which constitutes a state signal for cell 10. Write transistor 30 also has a source connected to memory node 25, which serves as an output terminal for the write device, and a gate or control terminal, which is connected to a write terminal 32 adapted to have a write signal applied thereto.

An amplifier, which in this embodiment is a single transistor 35 but may contain additional components for specific applications, also forms a portion of cell 10. Transistor 35 has a gate 36 connected to memory node 25 and operating as an input terminal for the amplifier. A source 37 of transistor 35 is connected to a reference potential, in this example, ground and a drain 38 of transistor 35 operates as the output terminal of the amplifier.

Finally, cell 10 includes a read switch, which in this embodiment is a single transistor 40 but which may be a variety of different switching devices known in the art. Transistor 40 includes a source 41 connected to drain 38 of transistor 35 and a drain 42 which operates as the output terminal of the read switch and the output terminal of cell 10. Also, transistor 40 includes a gate or control terminal 43, which operates as a read terminal for cell 10.

Figure 2:
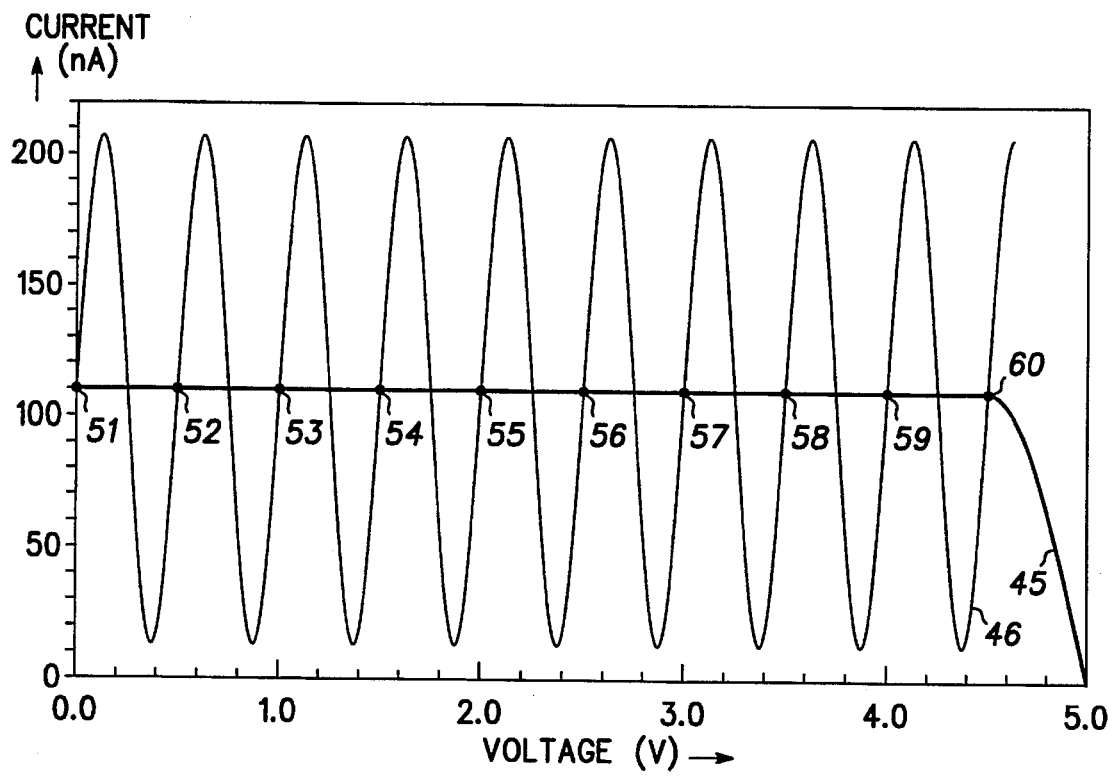
FIG. 2 is a current-voltage characteristic of a memory node in the multistate SRAM cell of FIG. 1.

In the operation of multistate SRAM cell 10, the N negative differential resistance diodes 11 through 19 and load 20 form a load line which provides N+1 stable states at memory node 25. Referring to FIG. 2, a waveform is shown which illustrates the current/voltage characteristics of nine diodes 11 through 19 in series. It will of course be understood that N can represent any desired number of diodes but generally represents a whole number greater than two. A load line 45 for transistor 20 intersects a load line 46 for diodes 11 through 19 at ten different stable points designated 51 through 60. It should be noted that the crossings of load line 45 in the negative differential resistance regions for each of diodes 11 through 19 do not represent stable memory states.

Figure 3:
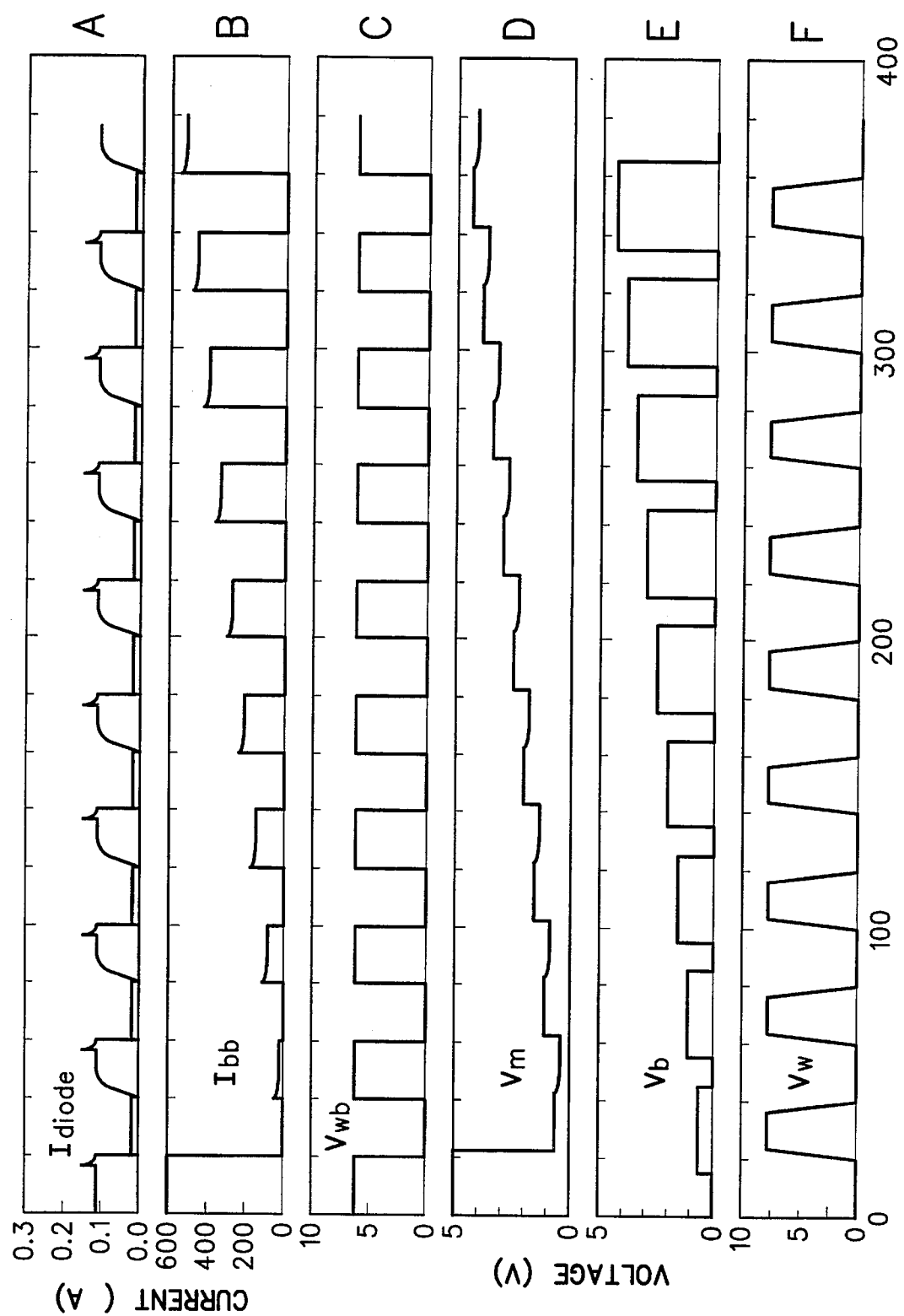
FIG. 3 illustrates various voltage and current waveforms present at different points in the multistate SRAM cell of FIG. 1.

In order to write memory node 25 of cell 10 to a specific state, a state signal, which is any selected one of N+1 different amplitudes of voltage, is applied to state terminal 31. Referring to FIG. 3, various waveforms and timing for cell 10 are illustrated, with the N+1 state signals or amplitudes of voltage illustrated as waveform 'E'. While all ten states are illustrated sequentially in FIG. 3, it will be understood that each of the steps can be selected individually and the various points for that state are represented along a vertical reference by the various waveforms. A write signal (waveform 'F') is applied to terminal 32 to turn transistor 30 ON and allow the state signal to bias memory node 25 to a stable state equal to the selected state signal, as depicted by waveform 'D'. When the write signal returns to zero (logic low), memory node 25 remains at the selected state (stable state 51–60).

In order to read the information stored in cell 10, a read signal (waveform 'C') is applied to read terminal 43 and the current at cell output terminal 42 (waveform 'B') is sensed. The different states define different gate voltages on the amplifier, transistor 35, and thus different sensing current through the read switch, transistor 40. Waveform 'A' simply illustrates the current flowing in diodes 11 through 19.

Figure 4:
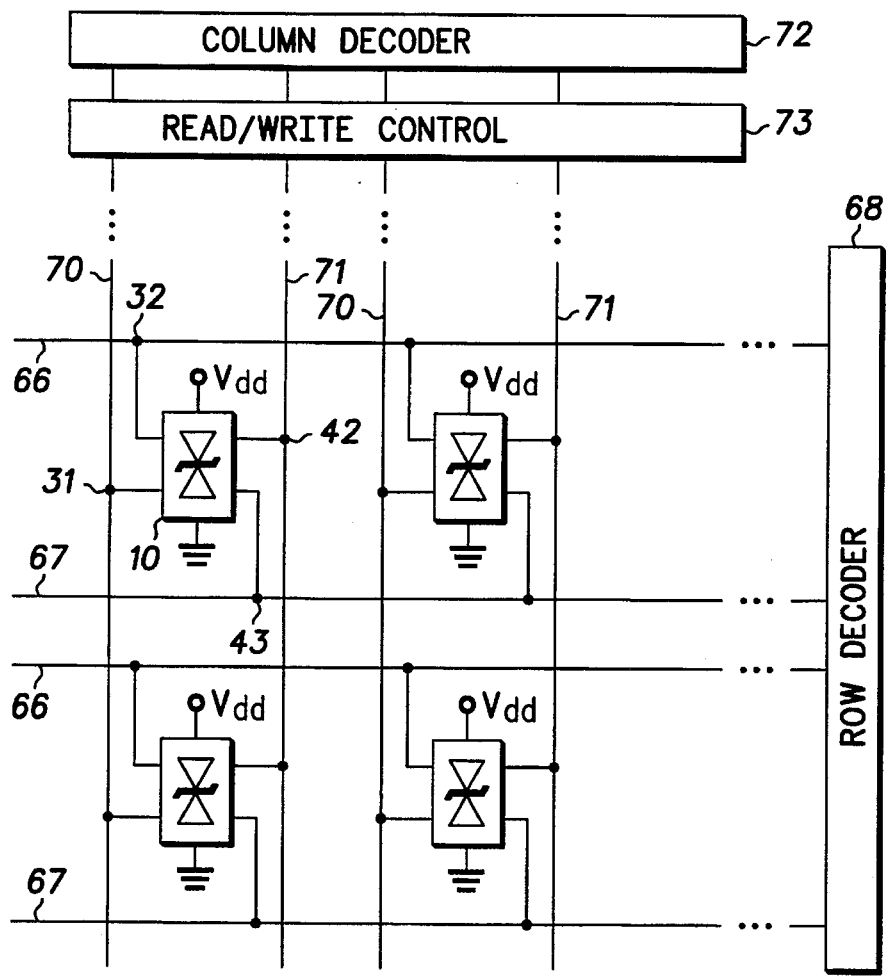
FIG. 4 is a schematic/block diagram of a multistate SRAM array including a plurality of the multistate SRAM cells of FIG. 1.

Turning now to FIG. 4, a schematic/block diagram of a multistate SRAM array 65 is illustrated including a plurality of the multistate SRAM cells, each similar to multistate SRAM cell 10 of FIG. 1. The plurality of multistate SRAM cells are arranged in rows and columns, each row defined by a pair of lines 66/67 connected to a row decoder 68 and each column defined by a pair of lines 70/71 connected to a column decoder 72 and a read/write control 73. For purposes of this description a single cell (cell 10) of array 65 will be explained using the numeric designations of FIG. 1. It will of course be understood that each of the other cells of array 65 are connected in a similar fashion and are individually addressed in a normal process through row decoder 68 and column decoder 72.

Figure 5:
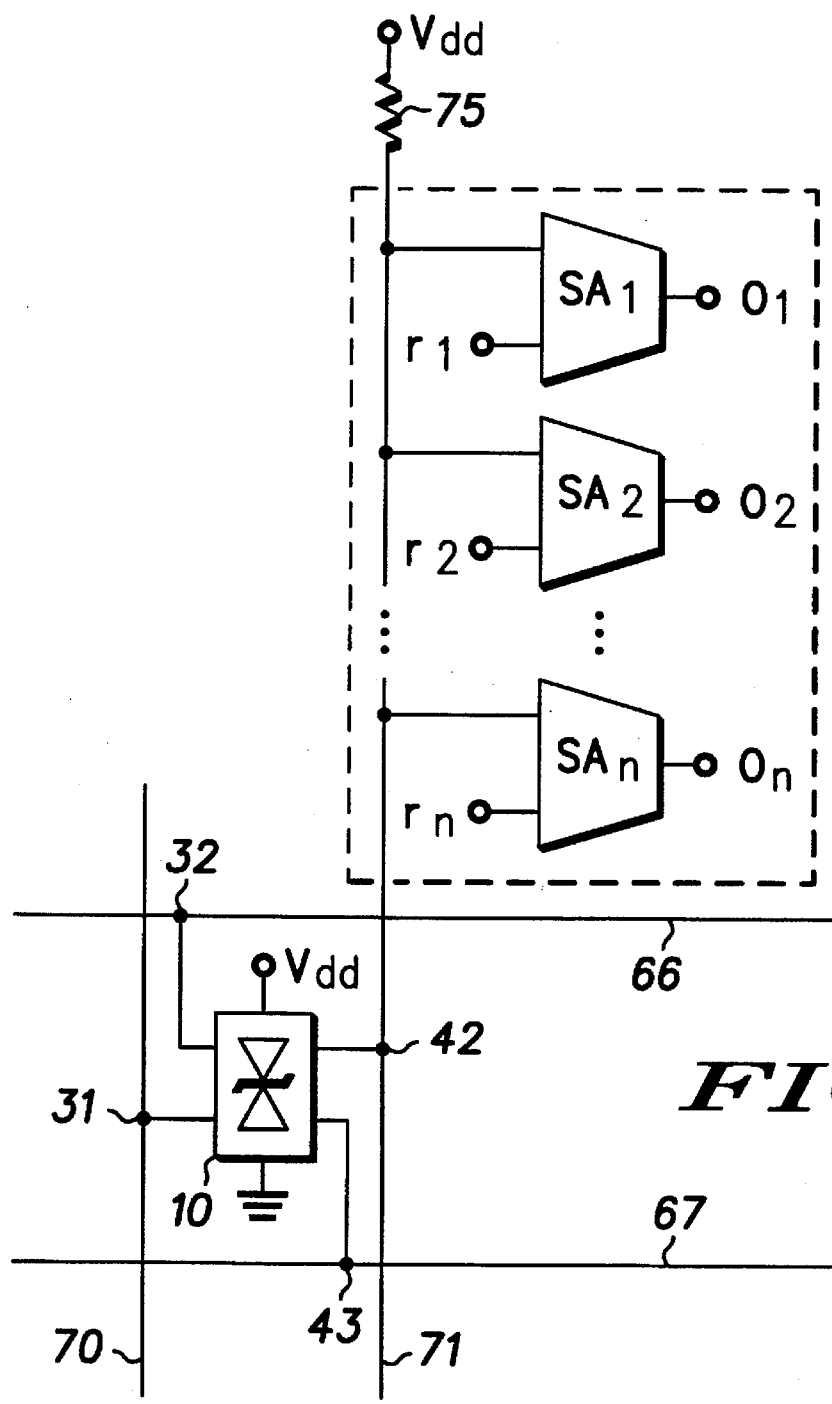
FIG. 5 is a schematic diagram including a portion of the readout in block diagram.

Write terminal 32 of cell 10 is connected to line 66 which has appropriately timed write signals thereon supplied by row decoder 68. Read terminal 43 of cell 10 is connected to line 67 which has appropriately timed read signals thereon supplied by row decoder 68. State input 31 of cell 10 is connected to line 70, which has appropriate state signals applied thereto by read/write control 73. Cell output terminal 42 of cell 10 is connected to line 71 which has N+1 differential sense amplifiers $SA_1$ through $SA_N$ (in this specific example ten) connected thereto for sensing the different output currents representative of the different states and supplying output signals to N+1 different output terminals $0_1$ through $O_N$, as illustrated in FIG. 5. One input of each differential sense amplifiers $SA_1$ through $SA_N$ is connected to line 71 and a second input is connected to a different reference voltage $r_1$ through $r_N$ representative of the ten different states. An end of line 71 is connected through a current limiting resistor 75 to an appropriate voltage potential $V_{DD}$.

Figure 6:
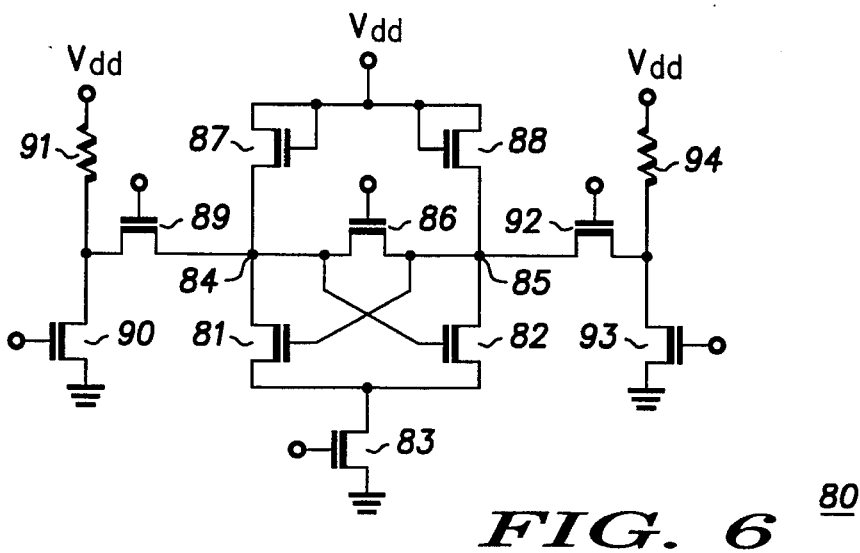
FIG. 6 is a schematic diagram of a differential sense amplifier which may be used in the block diagram of FIG. 5.
Figure 7:
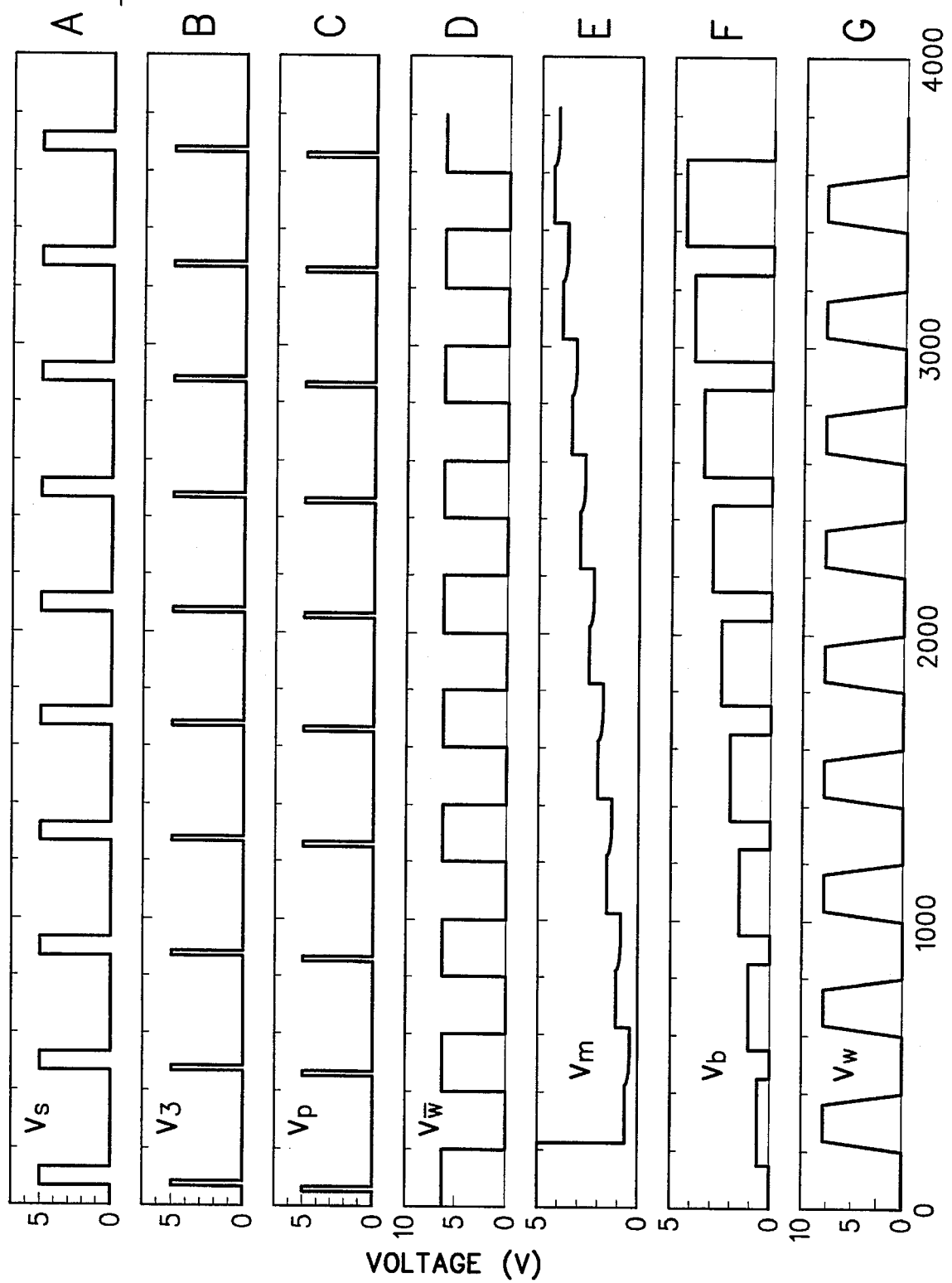
FIGS. 7/8 illustrate various voltage-time waveforms available in N of the differential sense amplifiers of FIG. 6 and the multistate SRAM cell of FIG. 1 when they are connected together.

Referring to FIG. 6, a schematic diagram of a differential sense amplifier 80 is illustrated which may be used as each of sense amplifiers $SA_1$ through $SA_N$ of FIG. 5. Amplifier 80 includes a pair of differentially connected transistors 81 and 82 each having a current carrying terminal connected in common through a transistor 83 to ground. A gate of transistor 83 is connected to receive a control signal (waveform 'A' of FIG. 7) thereon. A second current carrying terminal of transistor 81 is connected to an output node 84 and a second current carrying terminal of transistor 82 is connected to an output node 85. Node 84 is also connected to a gate terminal of transistor 82 and node 85 is connected to a gate terminal of transistor 81. Nodes 84 and 85 are connected through current carrying terminals of a transistor 86, a gate terminal of which is connected to receive a control signal (waveform 'C' of FIG. 7) thereon. Node 84 is also connected through the current carrying terminals of a transistor 87 to an appropriate potential $V_{DD}$, with the gate terminal of transistor 87 also connected to potential $V_{DD}$. Node 85 is also connected through the current carrying terminals of a transistor 88 to an appropriate potential $V_{DD}$, with the gate terminal of transistor 88 also connected to potential $V_{DD}$.

Finally, node 84 is connected through the current carrying terminals of a transistor 89 and the current carrying terminals of a transistor 90, connected in series, to ground. The junction of transistors 89 and 90 is connected through a resistor 91 to potential $V_{DD}$. A gate terminal of transistor 89 is connected to receive a control signal (waveform 'B' of FIG. 7) thereon and a gate terminal of transistor 90 is the input terminal which is connected to line 71 (waveform 'F' of FIG. 7). Also, node 85 is connected through the current carrying terminals of a transistor 92 and the current carrying terminals of a transistor 93, connected in series, to ground. The junction of transistors 92 and 93 is connected through a resistor 94 to potential $V_{DD}$. A gate terminal of transistor 92 is connected to receive a control signal (waveform 'B' of FIG. 7) thereon and a gate terminal of transistor 93 is a reference input terminal which is connected to a selected reference voltage $r_1$ through $r_N$.

Referring specifically to FIG. 8, waveforms 'H' through 'R' depict the outputs on node 84 of each of amplifiers $SA_1$ through $SA_N$. Corresponding control signals of the address lines and sense amplifiers are illustrated in a correct timing sense along a vertical reference by the various waveforms. Thus, each cell of array 65 has a multistate memory, as in this example ten different states. Also, because each of the cells uses a plurality of negative differential resistance diodes, which can be fabricated into a very small device, array 65 is very small and compact. Further, the amplifier incorporated into each cell greatly increases the speed of the cell and the multiple sense amplifiers used in the read process provide very fast sensing or read-out.

While I have shown and described specific embodiments of the present invention, further modifications and improvements will occur to those skilled in the art. I desire it to be understood, therefore, that this invention is not limited to the particular forms shown and I intend in the append claims to cover all modifications that do not depart from the spirit and scope of this invention.

What is claimed is:

1. A high density multistate SRAM cell comprising:

N negative differential resistance diodes connected in series and connected to a load, the negative differential resistance diodes and the load defining a memory node therebetween having N+1 stable states;

a write device having a control terminal, an input terminal adapted to receive N+1 different amplitudes of voltage thereon, and an output terminal connected to the memory node;

an amplifier having an input terminal connected to the memory node and an output terminal; and a read switch having an input terminal connected to the output terminal of the amplifier and an output terminal.

2. A high density multistate SRAM cell as claimed in claim 1 wherein the N negative differential resistance diodes include one of resonant tunneling diodes or Esaki diodes.

3. A high density multistate SRAM cell as claimed in claim 1 where, in the N negative differential resistance diodes, N is defined as a whole number greater than 1.

4. A high density multistate SRAM cell as claimed in claim 1 wherein the load is one of an active or passive device.

5. A high density multistate SRAM cell as claimed in claim 4 wherein the load is one of a transistor or a resistor.

6. A high density multistate SRAM cell as claimed in claim 1 wherein the write device includes a write transistor having a source, drain, and gate and further having the source connected to the memory node, the drain connected to receive N+1 different amplitudes of voltage thereon, and the gate forming the control terminal and connected to receive a write signal thereon.

7. A high density multistate SRAM cell as claimed in claim 1 wherein the amplifier includes a transistor having a gate which serves as the input terminal and is connected to the memory node and a drain forming the output terminal.

8. A high density multistate SRAM cell as claimed in claim 1 wherein the read switch includes a transistor having source, drain, and gate terminals, the source terminal forming the input terminal and connected to the output terminal of the amplifier, the drain terminal forming the output terminal of the read switch and an output terminal of the SRAM, and the gate forming a control terminal and connected to receive a read signal thereon.

9. A high density multistate SRAM cell comprising:

N negative differential resistance diodes connected in series and connected to a load, the negative differential resistance diodes and the load defining a memory node therebetween having N+1 stable states, N being defined as a whole number greater than 1;

a write transistor having a control terminal adapted to receive a write signal thereon, an input terminal adapted to receive N+1 different amplitudes of voltage thereon, and an output terminal connected to the memory node;

a transistor amplifier having a gate terminal connected to the memory node and an output terminal; and a read transistor having an input terminal connected to the output terminal of the transistor amplifier, a gate adapted to receive a read signal thereon, and an output terminal.

10. A high density multistate SRAM comprising:

a plurality of individual cells organized in a matrix of rows and columns, each individual cell including
      N negative differential resistance diodes connected in series
    and connected to a load, the negative differential resistance diodes
    and the load defining a memory node therebetween having N+1 stable states,
      a write device having a control terminal forming a cell write terminal, an input terminal adapted to receive N+1 different amplitudes of voltage thereon and forming a state terminal for the cell, and an output terminal connected to the memory node,
      an amplifier having an input terminal connected to the memory node and an output terminal, and
      a read switch having an input terminal connected to the output terminal of the amplifier, an output terminal forming a cell output terminal, and a control terminal forming a cell read terminal;

each individual column of the matrix including a state line connected to have N+1 different amplitudes of voltage applied thereto and an output line, the state line of each individual column being connected to the state terminal of each cell in the individual column and the output line of each individual column being connected to the cell output terminal of each cell in the individual column;

each individual row of the matrix including a write line connected to the cell write terminal for each cell in the individual row, and a cell read line connected to the cell read terminal of each cell in the individual row; and N+1 sense amplifiers associated with each individual column, each sense amplifier having an input terminal connected to the output line of the associated individual column and an output terminal.

11. A high density multistate SRAM as claimed in claim 10 wherein each of the N+1 sense amplifiers includes a differential amplifier with differential inputs, one differential input being connected to the output line of the associated individual column and another differential input having a reference voltage applied thereto, each of the N+1 sense amplifiers associated with an individual column having a different one of N+1 different amplitudes of reference voltage applied thereto.

12. A high density multistate SRAM as claimed in claim 10 wherein the N negative differential resistance diodes include one of resonant tunneling diodes or Esaki diodes.

13. A high density multistate SRAM as claimed in claim 10 where, in the N negative differential resistance diodes, N is defined as a whole number greater than 1.

14. A high density multistate SRAM as claimed in claim 10 wherein the load is one of an active or passive device.

15. A high density multistate SRAM as claimed in claim 14 wherein the load is one of a transistor or a resistor.

16. A high density multistate SRAM as claimed in claim 10 wherein the write device includes a write transistor having a source, drain, and gate and further having the source connected to the memory node, the drain connected to receive N+1 different amplitudes of voltage thereon, and the gate forming the control terminal and connected to receive a write signal thereon.

17. A high density multistate SRAM as claimed in claim 10 wherein the amplifier includes a transistor having a gate which serves as the input terminal and is connected to the memory node and a drain forming the output terminal.

18. A high density multistate SRAM as claimed in claim 10 wherein the read switch includes a transistor having source, drain, and gate terminals, the source terminal forming the input terminal and connected to the output terminal of the amplifier, the drain terminal forming the output terminal of the read switch and an output terminal of the SRAM, and the gate forming a control terminal and connected to receive a read signal thereon.

* * * * *